US012319623B2

United States Patent
Weimer et al.

(10) Patent No.: US 12,319,623 B2
(45) Date of Patent: Jun. 3, 2025

(54) PROCESS FOR IMPROVING FLASH SINTERING OF CERAMICS AND IMPROVED CERAMICS

(71) Applicant: The Regents of the University of Colorado, a body corporate, Denver, CO (US)

(72) Inventors: Alan Weimer, Niwot, CO (US); Bola Yoon, Boulder, CO (US); Rishi Raj, Boulder, CO (US); Rebecca O'Toole, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 784 days.

(21) Appl. No.: 17/434,719

(22) PCT Filed: Feb. 27, 2020

(86) PCT No.: PCT/US2020/020234
§ 371 (c)(1),
(2) Date: Aug. 27, 2021

(87) PCT Pub. No.: WO2020/176805
PCT Pub. Date: Sep. 3, 2020

(65) Prior Publication Data
US 2022/0127198 A1    Apr. 28, 2022

Related U.S. Application Data

(60) Provisional application No. 62/811,478, filed on Feb. 27, 2019.

(51) Int. Cl.
*C04B 35/628* (2006.01)
*C04B 35/117* (2006.01)
(Continued)

(52) U.S. Cl.
CPC ...... *C04B 35/62884* (2013.01); *C04B 35/117* (2013.01); *C04B 35/4885* (2013.01);
(Continued)

(58) Field of Classification Search
CPC ... C04B 35/628; C04B 35/563; C04B 35/565; C04B 35/581; C04B 35/488;
(Continued)

(56) References Cited

U.S. PATENT DOCUMENTS

2019/0345068 A1* 11/2019 Bartel .................. A61K 6/818

OTHER PUBLICATIONS

Kiran S. Naik et al., "Field assisted sintering of ceramic constituted by alumina and yttria stabilized zirconia", Journal of the European Ceramic Society, vol. 34, No. 10, (Sep. 1, 2014), pp. 2435-2442. (Year: 2014).*

* cited by examiner

*Primary Examiner* — Karie O'Neill Apicella
(74) *Attorney, Agent, or Firm* — Snell & Wilmer L.L.P.

(57) ABSTRACT

Methods of flash sintering have been developed in which particle are initially coated with thin layers by atomic layer deposition (ALD). Examples are provided in which 8 mol % yttria-stabilized zirconia (8YSZ) particles are coated with small quantities of $Al_2O_3$ by particle atomic layer deposition (ALD). Sintered materials that result from the process have been characterized. Sintered materials having unique characteristics are also described.

20 Claims, 6 Drawing Sheets

(51) Int. Cl.
   *C04B 35/488* (2006.01)
   *C04B 35/563* (2006.01)
   *C04B 35/565* (2006.01)
   *C04B 35/581* (2006.01)
   *C04B 35/64* (2006.01)
   *C23C 16/40* (2006.01)
   *C23C 16/44* (2006.01)
   *C23C 16/455* (2006.01)
   *C23C 16/56* (2006.01)
   *H01M 8/12* (2016.01)
   *H01M 8/1253* (2016.01)

(52) U.S. Cl.
   CPC .......... *C04B 35/563* (2013.01); *C04B 35/565* (2013.01); *C04B 35/581* (2013.01); *C04B 35/6281* (2013.01); *C04B 35/62813* (2013.01); *C04B 35/62815* (2013.01); *C04B 35/62836* (2013.01); *C04B 35/62889* (2013.01); *C04B 35/62894* (2013.01); *C04B 35/62897* (2013.01); *C04B 35/64* (2013.01); *C23C 16/403* (2013.01); *C23C 16/4417* (2013.01); *C23C 16/45555* (2013.01); *C23C 16/56* (2013.01); *H01M 8/1253* (2013.01); *C04B 2235/3206* (2013.01); *C04B 2235/3208* (2013.01); *C04B 2235/3217* (2013.01); *C04B 2235/3225* (2013.01); *C04B 2235/3246* (2013.01); *C04B 2235/3821* (2013.01); *C04B 2235/3826* (2013.01); *C04B 2235/3865* (2013.01); *C04B 2235/66* (2013.01); *C04B 2235/785* (2013.01); *C04B 2235/786* (2013.01); *H01M 2008/1293* (2013.01); *H01M 2300/0077* (2013.01); *H01M 2300/0094* (2013.01)

(58) Field of Classification Search
   CPC .... C04B 35/117; C04B 35/64; H01M 8/1253; C23C 16/455; C23C 16/40; C23C 16/44; C23C 16/56
   See application file for complete search history.

Fig. 8 ns in the presence of a small amount of alumina. J Am Ceram Soc. 2008; 91(8):2534-9.

PROCESS FOR IMPROVING FLASH SINTERING OF CERAMICS AND IMPROVED CERAMICS

RELATED APPLICATIONS

This application is a national stage filing and claims the priority benefit of PCT/US2020/020234, filed Feb. 27, 2020, and also claims the priority benefit of U.S. Patent Provisional Application No. 62/811,478, filed Feb. 27, 2019.

STATEMENT REGARDING FEDERALLY-SPONSORED RESEARCH OR DEVELOPMENT

This invention was made with government support under grant number W911NF-16-1-0200, awarded by the U.S. Army Research Office, and grant number CMMI1563537, awarded by the National Science Foundation. The government has certain rights in the invention.

INTRODUCTION

At elevated temperatures, eight mol % yttria-stabilized cubic zirconia (8YSZ) has a moderate oxygen ion conductivity and is chemically stable, leading to its prominent use as a solid oxide fuel cell (SOFC) electrolyte material.[1] In 2011, researchers demonstrated that the furnace temperature needed to achieve near-theoretical density 8YSZ can be reduced from ~1500 to 750° C. by applying a 150 V cm$^{-1}$ electric field across the sample.[2] This type of field assisted sintering, known as flash sintering, has been used to densify many ceramic materials including stabilized-$ZrO_2$,[2-5] magnesium-doped aluminum oxide ($Al_2O_3$),[6] yttrium oxide ($Y_2O_3$),[7] composite $Al_2O_3$/stabilized-$ZrO_2$,[8-9] and others. During typical voltage-to-current control flash sintering experiments, a constant electric field is applied across the sample and the furnace temperature is linearly increased until the "flash event" occurs, where a rapid increase in sample conductivity causes significant power dissipation in the sample and rapid sintering.[3] Additionally, slowing densification may lead to greater insights into the flash sintering densification mechanism, as there has been considerable debate within the flash sintering community regarding the cause of unusually high sintering rates. Hypothesized mechanisms include Joule heating at fast heating rates and an avalanche of Frenkel defects with concentrations far from equilibrium.[9,11-13]

Publications investigating the flash sintering behavior of 8YSZ are typically limited to the pure material.[2,14] However, the addition of small quantities of $Al_2O_3$ to 8YSZ prior to conventional sintering reduces the furnace temperature needed to achieve high densities by ~75° C. and alters the rate of 8YSZ grain growth.[15-19] Generally, $Al_2O_3$ is added to stabilized-$ZrO_2$ by milling[18-21] or colloidal processing,[16,17, 22-24] but this can lead to a heterogeneous dispersion of $Al_2O_3$ throughout the green body which can negatively affect sintering and material properties.

1. Mahato N, Banerjee A, Gupta A, Omar S, Balani K. Progress in material selection for solid oxide fuel cell technology: A review. Prog Mater Sci. 2015; 72:141-337.
2. Cologna M, Prette A L G, Raj R. Flash-Sintering of Cubic Yttria-Stabilized Zirconia at 750° C. for Possible Use in SOFC Manufacturing. J Am Ceram Soc. 2011; 94(2):316-9.
3. Cologna M, Rashkova B, Raj R. Flash Sintering of Nanograin Zirconia in <5 s at 850° C. J Am Ceram Soc. 2010; 93(11):3556-9.
4. Francis J S C, Cologna M, Raj R. Particle size effects in flash sintering. J Eur Ceram Soc. 2012; 32(12):3129-36.
5. Qin W, Majidi H, Yun J, van Benthem K. Electrode Effects on Microstructure Formation During FLASH Sintering of Yttrium-Stabilized Zirconia. J Am Ceram Soc. 2016; 99(7):2253-9.
6. Cologna M, Francis J S C, Raj R. Field assisted and flash sintering of alumina and its relationship to conductivity and MgO-doping. J Eur Ceram Soc. 2011; 31(15):2827-37.
7. Yoshida H, Sakka Y, Yamamoto T, Lebrun J-M, Raj R. Densification behaviour and microstructural development in undoped yttria prepared by flash-sintering. J Eur Ceram Soc. 2014; 34(4):991-1000.
8. Naik K S, Sglavo V M, Raj R. Field assisted sintering of ceramic constituted by alumina and yttria stabilized zirconia. J Eur Ceram Soc. 2014; 34(10):2435-42.
10. Naik K S, Sglavo V M, Raj R. Flash sintering as a nucleation phenomenon and a model thereof. J Eur Ceram Soc. 2014; 34(15):4063-7.
11. Lebrun J-M, Hellberg C S, Jha S K, Kriven W M, Steveson A, Seymour K C, Bernstein N, Erwin S C, Raj R. In-situ measurements of lattice expansion related to defect generation during flash sintering. J Am Ceram Soc. 2017; 100(11):4965-70.
12. Yoon B, Yadav D, Raj R, Sortino E, Ghose S, Sarin P, Shoemaker D. Measurement of O and Ti atom displacements in TiO2 during flash sintering experiments. J Am Ceram Soc. 2018; 101(5):1811-7.
13. Ji W, Parker B, Falco S, Zhang J Y, Fu Z Y, Todd R I. Ultra-fast firing: Effect of heating rate on sintering of 3YSZ, with and without an electric field. J Eur Ceram Soc. 2017; 37(6):2547-51.
14. Pereira da Silva J G, Lebrun J-M, Al-Qureshi H A, Janssen R, Raj R. Temperature Distributions During Flash Sintering of 8% Yttria-Stabilized Zirconia. J Am Ceram Soc. 2015; 98(11):3525-8.
15. Suarez G, Sakka Y. Effect of alumina addition on initial sintering of cubic ZrO2 (8YSZ). Ceram Int. 2010; 36(3): 879-85.
16. Tekeli S, Erdogan M, Aktas B. Influence of α-Al2O3 addition on sintering and grain growth behaviour of 8 mol % Y2O3-stabilised cubic zirconia (c-ZrO2). Ceram Int. 2004; 30(8):2203-9.
17. Song X, Lu J, Zhang T, Ma J. Two-stage master sintering curve approach to sintering kinetics of undoped and $Al_2O_3$-doped 8 mol % yttria-stabilized cubic zirconia. J Am Ceram Soc. 2011; 94(4):1053-9.
18. Yu F, Xiao J, Lei L, Cai W, Zhang Y, Liu J, Liu M. Effects of doping alumina on the electrical and sintering performances of yttrium-stabilized-zirconia. Solid State Ionics. 2016; 289(Supplement C):28-34.
19. Matsui K, Tanaka K, Yamakawa T, Uehara M, Enomoto N, Hojo J. Sintering kinetics at isothermal shrinkage: II, effect of Y2O3 concentration on the initial sintering stage of fine zirconia powder. J Am Ceram Soc. 2007; 90(2): 443-7.
20. Matsui K, Tanaka K, Enomoto N, Hojo J. Sintering kinetics at constant rates of heating: effect of alumina on the initial sintering stage of yttria-stabilized cubic zirconia powder. J Ceram Soc Jpn. 2006; 114(1333):763-8.
21. Matsui K, Yamakawa T, Uehara M, Enomoto N, Hojo J. Mechanism of alumina-enhanced sintering of fine zirconia powder: influence of alumina concentration on the initial stage sintering. J Am Ceram Soc. 2008; 91(6): 1888-97.
22. Tekeli S, Demir U. Colloidal processing, sintering and static grain growth behaviour of alumina-doped cubic zirconia. Ceram Int. 2005; 31(7):973-80.
23. Wang J, Raj R. Estimate of the activation energies for boundary diffusion from rate-controlled sintering of pure alumina, and alumina doped with zirconia or titania. J Am Ceram Soc. 1990; 73(5):1172-5.
24. Wang J, Raj R. Activation energy for the sintering of two-phase alumina/zirconia ceramics. J Am Ceram Soc. 1991; 74(8):1959-63.
25. Raj R, Lange F F. Crystallization of small quantities of glass (or a liquid) segregated in grain boundaries. Acta Metall. 1981; 29(12):1993-2000.

SUMMARY OF THE INVENTION

Atomic layer deposition (ALD) can be used to incorporate secondary phases into ceramic powders for flash sintering. ALD is a gas-phase deposition technique that uses self-limited surface reactions to grow conformal thin films of desired thickness on a particle surface. Particle ALD can be used to add the secondary phase to ceramic particles for flash sintering, ensuring the secondary phase is well-dispersed prior to densification and enabling precise control over the amount of secondary phase added. This will ensure that sufficient secondary phase is present in all regions of the part during flash sintering to enhance densification, microstructural homogeneity, and impurity scavenging. Particle ALD can be used to homogeneously disperse the secondary phase throughout a ceramic green body to alter densification behavior, microstructure, and properties of interest.

In a first aspect, the invention provides a method of flash sintering, comprising: providing particles comprising a first phase and having a surface; using ALD to grow a film of a second phase on the surface of the particles to form a coated powder composition; and flash sintering the coated powder composition. Flash sintering is a well-known process in which a composition of particles (typically but not necessarily a green body compact) is sintered under the influence of an electric field until a flash event occurs where a rapid increase in the composition's conductivity causes significant power dissipation and rapid sintering. Flash sintering is described in detail by Raj et al. in U.S. Pat. No. 8,940,220, which is incorporated herein as if reproduced in full below.

The invention can be further characterized by one or any combination of the following features: wherein the ALD coating on the coated powder composition is semi-continuous and covers 90% (or 70% or 50%) or less (or between 10% and 90% or 10% and 50%) of the surface area of the particles; comprising, prior to the step of flash sintering, mixing the coated powder with a binder, forming a shaped component, and heating the shaped component to burn out the binder; wherein ALD is used to grow an alumina film; comprising one to five cycles of ALD; wherein the alumina film has a thickness of between about 0.5 nm and about 1 nm; comprising at least 9 cycles of ALD; wherein the second phase increases the temperature at which flash sintering occurs, relative to the first phase or alternatively wherein the second phase decreases the temperature at which flash sintering occurs, relative to the first phase; wherein the first phase is boron carbide; wherein the first phase comprises YSZ, $BaTiO_3$ or other titanate, $LiNbO_3$, $TiO_2$, $Y_3Al_5O_{12}$, indium tin oxide, or $MgAl_2O_4$; and/or the second phase comprises $Al_2O_3$, $Y_2O_3$, MgO, or $V_2O_5$. In some embodiments, the second phase comprises 0.1 to 10 wt %, 0.5 to 10 wt %, 1 to 10 wt %, or 1 to 5 wt % of the sintered ceramic and, in some embodiments, the first phase comprises 80 to 99.9 wt % of the first phase. Any one or any combination of these features mentioned above may also be present in any of the sintered articles described herein.

The thickness or number of ALD cycles was surprisingly found to have an effect on the properties of the sintered article. One to five cycles of ALD was found to increase grain size while nine or more cycles results in smaller grain sizes than only five cycles. It can be estimated that larger grain size occur between 1 and 8 cycles of ALD.

The invention also may include an article made by any of the inventive methods. For example, where the core particle comprises YSZ and the article comprises a SOFC electrolyte. The invention may also include green articles (typically in sheet form) comprising the coated particles dispersed in a binder; for example 5 to 15 wt % binder.

In some preferred embodiments, the methods or articles comprise 3YSZ particles coated with ALD alumina, or SiC particles coated with AlN, $Al_2O_3$, or $Y_2O_3$, or AlN particles coated with $Y_2O_3$ and/or CaO, or $Al_2O_3$ particles coated with MgO.

In a further aspect, the invention provides an eight mole percent yttria-stabilized zirconia (8YSZ) fired ceramic, comprising: a first phase comprising grains of crystalline 8YSZ and a second phase comprising largely amorphous $Al_2O_3$ grains dispersed in the first phase. Throughout this disclosure "largely amorphous" has the conventional meaning of greater than 50% (by vol) as measured by TEM. Preferably, at least 60% or at least 80% or at least 90%, or up to 90% or 95% amorphous. In some embodiments, the ceramic has a relative density of at least 88%. or at least 92% or at least 93% or from 88% to about 95%. As is well-known, relative density=experimental density/theoretical density *100. In some embodiments, the ceramic has an average grain size of 0.7 to 1.2 micrometer.

In another aspect, the invention provides a sintered ceramic article (also called a "composite" due to the presence of a plurality of phases) comprising a major phase and a minor phase that have been sintered together, wherein the major phase is largely crystalline and comprises at least 70 wt % of the composite, and wherein the minor phase is largely amorphous and comprises 10 wt % or less of the composite; wherein the minor phase exists in discrete, dispersed domains within the major phase; wherein the minor phase is a crystallizable material; and wherein the major phase has a crystallization temperature that is at least 50° C. or 100° C. or 150° C. greater than the crystallization temperature of the minor phase when crystallized under the same conditions.

We have discovered that flash sintering a coated powder can result in a sintered ceramic comprising these properties; the process appears to suppress sintering of the secondary phase that would possess a higher degree of crystallization under the conditions of conventional sintering. In some embodiments, the ceramic is sintered under atmospheric pressure. Typically, this composite cannot be formed by conventional sintering. Conventional sintering can be defined as sintering at a heating rate of between 5 and 15 C/min, and typically similar rates of cooling near the maximum temperature. In some preferred embodiments, the minor phase does not comprise silica; some preferred minor phases may include any of the following: alumina, vanadia, magnesia, yttria, or titania.

DETAILED DESCRIPTION OF THE INVENTION

1. General Description of Atomic Layer Deposition

Atomic layer controlled growth techniques permit the deposition of coatings of about 0.1 to about 5 angstroms in thickness per reaction cycle, and thus provide a means of extremely fine control over coating thickness. Thicker coatings can be prepared by repeating the reaction sequence to sequentially deposit additional layers of the coating material until the desired coating thickness is achieved.

The coating is deposited in an Atomic Layer Deposition (ALD) process. In the ALD process, the coating-forming reaction is conducted as a series of (typically) two half-reactions. In each of these half-reactions, a single reagent (precursor) is introduced into contact with the substrate surface. Conditions are such that the reagent is in the form of a gas. In most cases, the reagent reacts with functional groups on the surface of the particle and becomes bound to the particle. Because the reagent is a gas, it permeates into pores in the substrate and deposits onto the interior surfaces of the pores as well as onto the exterior surfaces of the substrate. This precursor is designed to react with the surface at all of the available surface sites but not react with itself. In this way, the first reaction occurs to form a single monolayer, or sub-monolayer, and creates a new surface functionality. Excess amounts of the reagent are then removed, which helps to prevent the growth of undesired, larger inclusions of the coating material. Each remaining half-reaction is then conducted in turn, each time introducing a first reagent, allowing it to react at the surface of the particle, and removing excess reagent before introducing the next reagent. Usually, an inert carrier gas is used to introduce the reagents, and the reaction chamber is usually swept with the carrier gas between successive reagent introductions to help remove excess reagents and gaseous reaction products. A vacuum may be pulled during and between successive dosings of reagents, to further remove excess reagents and gaseous reaction products.

After exposure to the first precursor, the surface is then exposed to the second precursor, also typically dispersed in an inert carrier gas. This precursor is designed to react with the functional groups put down in the first reaction step. This reaction also happens until all of the available surface sites are reacted. The second precursor also does not react with itself. Any excess of the second precursor is also removed in an optional inert gas purge step. If the gases are metered properly, the purge step may be unnecessary. This may be at least a 4 step process (precursor 1, purge, precursor 2, purge) to deposit one monolayer of the film which is being grown. This process is repeated as many times as is necessary to build up the desired film thickness. The ALD process may start with a "linker" agent that facilitates covalent bonding to the surface, or it may end with a terminating agent that may be hydrophobic or otherwise engineered for a specific purpose.

For purposes of the present invention, the ALD process may include only a half reaction, rather than a full cycle. However, at least one full cycle is preferred, more preferably at least five cycles.

A convenient method for applying the coating to a particulate substrate is to form a fluidized or otherwise agitated bed of the particles, and then pass the various reagents in turn through the fluidized bed under reaction conditions. Methods of fluidizing particulate materials are well known, and generally include supporting the particles on a porous plate or screen. A fluidizing gas is passed upwardly through the plate or screen, lifting the particles somewhat and expanding the volume of the bed. With appropriate expansion, the particles behave much as a fluid. Reagents (in gaseous, liquid, or solid phase) can be introduced into the bed for reaction with the surface of the particles. Liquid or solid reagents convert to gaseous form once inside the bed prior to reaction with particles. In this invention, the fluidizing gas also can act as an inert purge gas for removing unreacted reagents and volatile or gaseous reaction products. In addition, the reactions can be conducted at particle surfaces in a rotating cylindrical vessel, a rotating tube, or a vibrating bed. This vibrating bed method is particularly suitable for continuous processes.

Reaction conditions are selected mainly to meet three criteria. The first criterion is that the reagents are gaseous under the conditions of the reaction. Therefore, temperature and pressure conditions are selected such that the reactants volatilize before reaction. The second criterion is one of reactivity. Conditions, particularly temperature, are selected such that the desired reaction between the film-forming reagents (or, at the start of the reaction, the first-introduced reagent and the particle surface) occurs at a commercially reasonable rate. The third criterion is that the substrate is thermally stable, from a chemical standpoint and from a physical standpoint. The substrate should not degrade or react at the process temperature, other than a possible reaction on surface functional groups with one of the ALD precursors at the early stages of the process. Similarly, the substrate should not melt or soften at the process temperature, so that the physical geometry, especially pore structure, of the substrate is maintained. The reactions are generally performed at temperatures from about 270 to 1000 K, preferably from 290 to 450 K, with specific temperatures in each case being below the temperature at which the substrate melts, softens or degrades.

Between successive dosings of the reagents, the particles are subjected to conditions sufficient to remove reaction products and unreacted reagents. This can be done, for example, by subjecting the particles to a high vacuum, such as about $10^{-5}$ Torr or greater, after each reaction step. Another method of accomplishing this, which is more readily applicable for industrial application, is to sweep the particles with an inert purge gas between the reaction steps. This purge gas can also act as a fluidizing medium for the particles and as a carrier for the reagents.

Several techniques are useful for monitoring the progress of the reaction. For example, vibrational spectroscopic studies can be performed using transmission Fourier transform infrared techniques. The deposited coatings can be examined using in situ spectroscopic ellipsometry. Atomic force microscopy studies can be used to characterize the roughness of the coating relative to that of the surface of the substrate. X-ray photoelectron spectroscopy and x-ray diffraction can be used to do depth-profiling and ascertain the crystallographic structure of the coating.

Aluminum oxide coatings are conveniently deposited using trimethylaluminum and water as the precursors, as illustrated by reaction sequence A1/B1. The illustrated reactions are not balanced, and are only intended to show the reactions at the surface of the substrate (i.e., not inter- or intralayer reactions).

Substrate-XH*+Al(CH$_3$)$_3$=Substrate-X—Al*—CH$_3$+ CH$_4$ (precursor reaction)

Substrate-X—Al*—CH$_3$+H$_2$O=Substrate-X—Al—OH*+CH$_4$ (A1)

Substrate-X—Al—OH*+Al(CH$_3$)$_3$=Substrate-X—Al—O-A-l*-CH$_3$+CH$_4$ (B1)

In reactions A1/B1, X is typically oxygen, nitrogen or sulfur, and the asterisk (*) represents the surface species at which the next half-reaction can occur. An aluminum oxide film is built up by repeating reactions A1 and B1 in alternating fashion, until the desired coating thickness is achieved. Aluminum oxide films tend to grow at a rate of approximately 0.3 nm/cycle using this reaction sequence.

Titanium oxide coatings are conveniently deposited using titanium tetrachloride and water and/or hydrogen peroxide as the precursors, as illustrated by reaction sequence A2/B2. As before, the illustrated reactions are not balanced, and are only intended to show the reactions at the surface of the particles (i.e., not inter- or intralayer reactions).

Substrate-XH*+TiCl$_4$=Substrate-X—Ti*-Cl$_3$+HCl (precursor reaction)

Substrate-X—Ti*-Cl$_3$+H$_2$O$_2$=Substrate-X-T-i*-OH+HCl+Cl$_2$ (A2)

Substrate-X—Ti*—OH+TiCl$_4$

Substrate-X—Ti—O—Ti*-Cl$_3$+HCl (B2)

In reactions A2/B2, X is typically oxygen, nitrogen or sulfur, and the asterisk (*) represents the surface species at which the next half-reaction can occur. A titanium oxide film is built up by repeating reactions A2 and B2 in alternating fashion, until the desired coating thickness is achieved. Titanium oxide films tend to grow at a rate of approximately 0.05-0.1 nm/cycle using this reaction sequence.

As is known for ALD processes, the order can be AB, ABC, ABCD, ABCDABABCD, or any desired order provided that the chemical entities react with each other in the desired order. Each of the reactants has at least two reactive moieties (this includes the possibility that the reactant is modifiable to have two reactive moieties such as having a first reactive moiety and a second reactive moiety that is temporarily blocked by a protecting group or requires activation for subsequent reaction such as UV activation). In some preferred embodiments, the reactants have exactly two reactive moieties since higher numbers of reactive groups may lead to lower packing density. In some preferred embodiments, the films have at least three repeating units (e.g., ABABAB), or at least 5, or at least 10, or at least 50, and sometimes in the range of 2 to 1000, or 5 to 100. By "reactive" it is meant under normal ALD conditions and commercially relevant timescales (for example, at least 50% reacted within 10 hours under appropriate reaction conditions). For control of film quality, the reactants may be singly reactive during each step of the ALD process to avoid reacting twice to the surface, and the reactants should not self-react and condense onto the surface.

Some ALD coatings are aluminum oxide and/or titanium oxide coatings. "Aluminum oxide" is used herein to designate a coating that is made up substantially entirely of aluminum and oxygen atoms, without reference to the specific stoichiometry. In many cases, it is expected that an aluminum oxide coating will correspond somewhat closely to the empirical structure of alumina, i.e., $Al_2O_3$, although deviations from this structure are common and may be substantial. "Titanium oxide" is used herein to designate a coating that is made up substantially entirely of titanium and oxygen atoms, without reference to the specific stoichiometry. In most cases, it is expected that a titanium oxide coating will correspond closely to the empirical structure of titania, i.e., $TiO_2$, although deviations from this structure are common and may be substantial. Similarly, considerations apply to understanding the other formulations described herein; although in some embodiments, the invention can be more specifically defined by the use of terms such as "consisting."

Except for the case of a half-reaction included in the broader aspects of the present invention, the atomic layer deposition process is characterized in that at least two different reactants are needed to form the coating layer. The reactants are introduced into the reaction zone individually, sequentially and in the gas phase. Excess amounts of reactant are removed from the reaction zone before introducing the next reactant. Reaction by-products are removed as well, between successive introductions of the reagents. This procedure ensures that reactions occur at the surface of the substrate, rather than in the gas phase.

A purge gas is typically introduced between the alternating feeds of the reactants, in order to further help to remove excess reactants. A carrier gas, which is usually but not necessarily the same as the purge gas, generally (but not always necessarily) is introduced during the time each reactant is introduced. The carrier gas may perform several functions, including (1) facilitating the removal of excess reactant and reaction by-products and (2) distributing the reactant through the reaction zone, thereby helping to expose all surfaces to the reactant. The purge gas does not react undesirably with the ALD reactants or the deposited coating, or interfere with their reaction with each other at the surface of the substrate.

Temperature and pressure conditions will depend on the particular reaction system, as it remains necessary to provide gaseous reactants. As is known for ALD processes, the temperature should be high enough to enable reactants in the gas phase but not so high that the product degrades.

2. Particle and Coating Characteristics

A set of preferred combinations of core particle and coating composition is shown in the Table below.

Table of Materials for Flash Sintering of Ceramics with ALD coated particles

| Core | ALD Coating(s) |
|---|---|
| $Al_2O_3$ | $Y_2O_3$, MgO |
| $Y_3Al_5O_{12}$ (YAG) | $Al_2O_3$, $Y_2O_3$ |
| $MgAl_2O_4$ | $Y_2O_3$, |
| 3YSZ ($ZrO_2/Y_2O_3$) | MgO, $Al_2O_3$ |
| 8YSZ ($ZrO_2/Y_2O_3$) | MgO, $Al_2O_3$ |
| $TiO_2$ | $Y_2O_3$, $V_2O_5$ |
| $BaTiO_3$ | $SiO_2$, $Nb_2O_5$ |
| $CeO_2$ | $Sm_2O_3$, $Gd_2O_3$ |
| SiC | $Al_2O_3$, $Y_2O_3$ |
| $B_4C$ | $TiB_2$ |

In some embodiments, the ALD film covers the entire surfaces of the core particles. In other embodiments, the ALD film is non-uniformly thick or semi-continuous. For example, the films may nucleate at different rates on different surface structures, especially where the core particle comprises a mix of materials or a mix of crystalline forms. Non-uniform or semi-continuous films are especially likely in applications with very low numbers of ALD cycles (e.g., five or less). In some embodiments, non-continuous islands of film are the optimal structure. Techniques used to determine non-uniform or semi-continuous could be a combination of HR-TEM, Low-energy ion scattering spectroscopy (LEIS), and compositional information. Anything less than 1 nm is likely to be a semi-continuous film, especially in the case of a crystalline material.

In some preferred embodiments, the particles, either individual particles within a mixture or the sum of all particles in a powder, comprise at least 80 mass % or at least 90 mass % of a single phase of material.

The particles, including any coatings, have diameters typically in the range of 0.01 to 1000 μm; preferably 100 to 500 μm; preferably 10 to 100 μm; and in some embodiments, at least 90 mass % of the particles have a diameter of 100 μm or less. For asymmetric particles, particle size is typically determined by optical microscopy based on the smallest dimension through the center of a particle.

The core particles preferably possess one or more of the following characteristics: spherical, spherical with satellites, identical chemical composition, little or no internal porosity, and/or low surface contamination. Satellites are nodules on the exterior of larger (usually spherical) particles. Satellites are typically formed during the production of the core metal particles, especially during the production of these materials from gas atomized processes. When gas atomization is used, the particles are produced in a range of sizes which coalesce together. The satellites are the relatively small particles which attach to the larger particles during the production.

The coating may comprise any coating that can be applied by atomic layer deposition. Some well-known coatings that can be applied to the metallic or other material core particle may comprise: oxides or mixed oxides (e.g., $Al_2O_3$, $TiO_2$, ZnO, $ZrO_2$, $SiO_2$, $HfO_2$, $Ta_2O_5$, LiNbxOy), nitrides (e.g., TiN, TaN, $W_2N$, $TiY_2N$), sulfides (e.g., ZnS, CdS, SnS, $WS_2$, $MoS_2$, $ZnIn_2S_4$), and phosphides (e.g., GaP, InP, $Fe_{0.5}Co_{0.5}P$). Some lesser known materials that can be applied to the core particle may comprise: metal fluorides (e.g., $AlF_3$, $MgF_2$, $ZnF_2$), oxy fluorides and oxy nitrides of transition metals (e.g. of Al, Cu, Co, W, Cr, Fe, Zn, Zr, Pt, Pd), lanthanides in either elemental, oxide, fluoride, nitride, boride, or sulfide form (e.g., Y, YN, $La_2O_3$, $LaF_3$, Nb, $Dy_2O_3$, Nd, $LaB_6$, $La_2S_3$ etc), borides (e.g., $TiB_2$), carbides (e.g., $B_4C$, WC), silanes, silicides and other silicon containing materials. This coating is highly uniform over the particle; preferably, there is no more than a 20%, more preferably no more than 10%, or no more than 5% variation in coating thickness over the surface of the particle. This high level of uniformity is a characteristic of the ALD process. Particles coated by ALD are distinguishable from particles coated by other methods by 1) the uniformity of film thickness and 2) the lack of change in particle size distribution of the individual core particles, which are not possible with other techniques.

Coatings, on core powders, typically have a thickness in the range of 0.1 to 100 nm; preferably 0.2 to 50 nm; more preferably 0.5 to 10 nm. Coating thickness can be measured by transmission electron microscopy (TEM).

The ALD coating preferably covers at least 60% of the surface, more preferably at least 80%, more preferably at least 95% and still more preferably at least 99% of the surface area of the particles.

The ALD coating preferably is conformal. By "conformal", it is meant that the thickness of the coating layer is relatively uniform across the surface of the particle (so that, for example, the thickest regions of the coating are no greater than 3 times, preferably not greater than 2 times, in some embodiments not greater than 20% thicker than the thickness of the thinnest regions).

In the examples, we add small quantities (<5 wt %) of $Al_2O_3$ to 8YSZ powders to determine the effect of $Al_2O_3$ on 8YSZ flash sintering behavior during voltage-to-current control and current rate experiments.

EXAMPLES

Powder Preparation

Commercial 8YSZ (>99.7 wt % $ZrO_2$+$HfO_2$+$Y_2O_3$) powder purchased from Tosoh (TZ-8Y) was used as the ALD substrate and for comparison to ALD-coated materials. 8YSZ powder was loaded into a 500 mL fluidized bed ALD reactor and dried at 180° C. and ~10 torr of nitrogen for 4 h. Subsequently, the substrate powder was coated with 0-9 cycles of $Al_2O_3$ALD to vary film thickness (0-9ALD, where 0-9 refers to the number of cycles). The sequential exposure of the substrate to trimethyl aluminum (TMA, $Al(CH_3)_3$) and water, with inert purges in-between, constitutes one ALD cycle. The 8YSZ powder was coated by 1, 5, and 9 cycles of $Al_2O_3$ALD to vary the film thickness and $Al_2O_3$ wt %.

Flash Sintering Experiments

To prepare dog-bone shaped powder compacts for flash sintering experiments, 8YSZ powder with and without $Al_2O_3$ was mixed with binder (Duramax B-1000, Dow Chemical). To disperse the binder and break-up agglomerates, 7 grams of 8YSZ powder, 0.35 grams of binder, and water were blended using a mortar and pestle. This mixture was dried at 100° C. for ~24 hours to remove water. Powder compacts were made by placing ~0.2 g of the powder/binder mixture into a dog-bone shaped stainless steel die (15 mm gauge length, 3.5 mm width, ~1.5 mm thickness) and applying a pressure of 150 MPa using a hydraulic press. The compacts were placed in a furnace and heated from room temperature to 600° C. at 2° C./min for 1 hour for the removal of binder. Dog-bone shaped compacts were prepared from 8YSZ powder with 0, 1, 5, and 9 cycles of $Al_2O_3$ALD. Prior to flash sintering experiments, platinum paste was painted onto the handles of the dog-bone shaped compact to enhance the electrical connection between the platinum electrodes and compact. The compact was hung from two platinum electrodes, which were connected to an electrical power supply, and placed in a vertical tubular furnace. All flash sintering experiments occurred in air. The furnace temperature was increased from room temperature to 900° C. at 20° C./min, which was followed by an isothermal hold at 900° C. for the remainder of the experiment. Next, the current density was increased at a current-rate of 40 mA $mm^{-2}$ $min^{-1}$ or 120 mA $mm^{-2}$ $min^{-1}$ to 120 mA $mm^{-2}$, causing densification of the sample. Once a current density of 120 mA $mm^{-2}$ was reached, the furnace and power supply were shut off and the sample cooled to room temperature. The current was measured by a digital multimeter and the voltage by the power supply, and this information was transmitted to Matlab and saved to a file. The power density was then calculated as the product of the current and voltage, divided by the volume of the sample gauge section. The total energy input normalized by volume was calculated by numerically integrating the power density over time. The final relative density was measured by the Archimedes method.

Microstructural Analysis

Samples were polished and thermally etched at 1250° C. for 30 minutes for microstructural analysis. Samples were coated with platinum and imaged using scanning electron microscopy (SEM) with backscattered electron detection, and the 8YSZ grain size was determined by the linear intercept method. 5ALD flash sintered at a current-rate of 40 mA/$mm^2$·min was prepared for transmission electron microscopy (TEM) by focused ion beam milling. TEM was then used to image the 8YSZ and $Al_2O_3$ grains.

Results and Discussion

Powder Characterization

Figure 1:
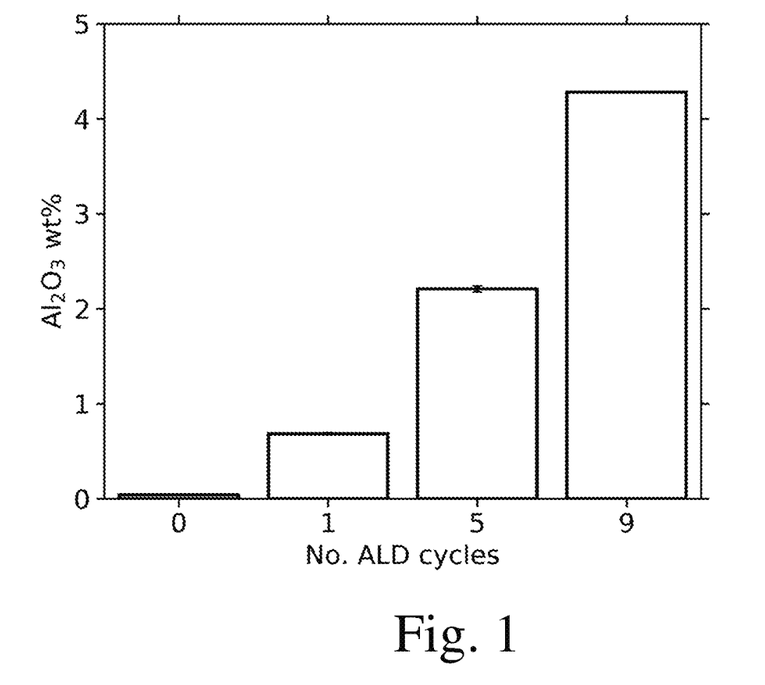
FIG. 1. $Al_2O_3$ concentration for 0-9ALD measured by inductively coupled plasma—optical emission spectroscopy.
Figure 2:
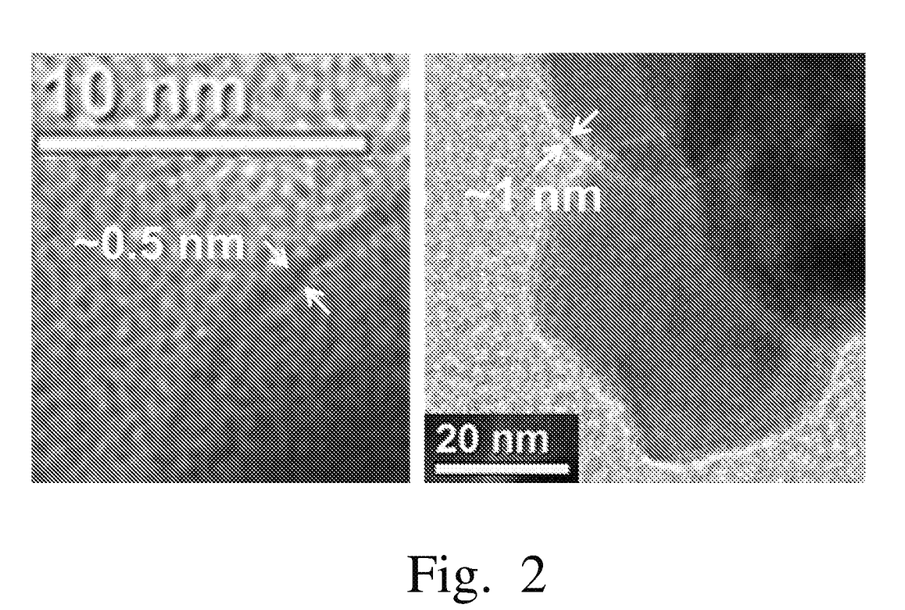
FIG. 2. High resolution transmission electron micrographs of ALD-coated powders, showing $Al_2O_3$ film thicknesses of ~0.5 nm and ~1 nm for 5ALD (left) and 9ALD (right), respectively.

Particle ALD was used to deposit an amorphous $Al_2O_3$ film on the surface of the 8YSZ particles. The $Al_2O_3$ wt % increased linearly with the number of cycles (FIG. 1) and increased by ~0.5 wt % with each additional cycle of $Al_2O_3$ALD. The thickness of the $Al_2O_3$ film was ~1 nm after 9 cycles of $Al_2O_3$ALD, corresponding to a growth rate of ~1 Å/cycle, and the amorphous $Al_2O_3$ film was conformal and uniform (FIG. 2). Thus, Particle ALD can be used to precisely control the initial quantity and location of $Al_2O_3$ and ensures that the $Al_2O_3$ is distributed homogeneously prior to densification.

Densification and Grain Growth

Figure 3:
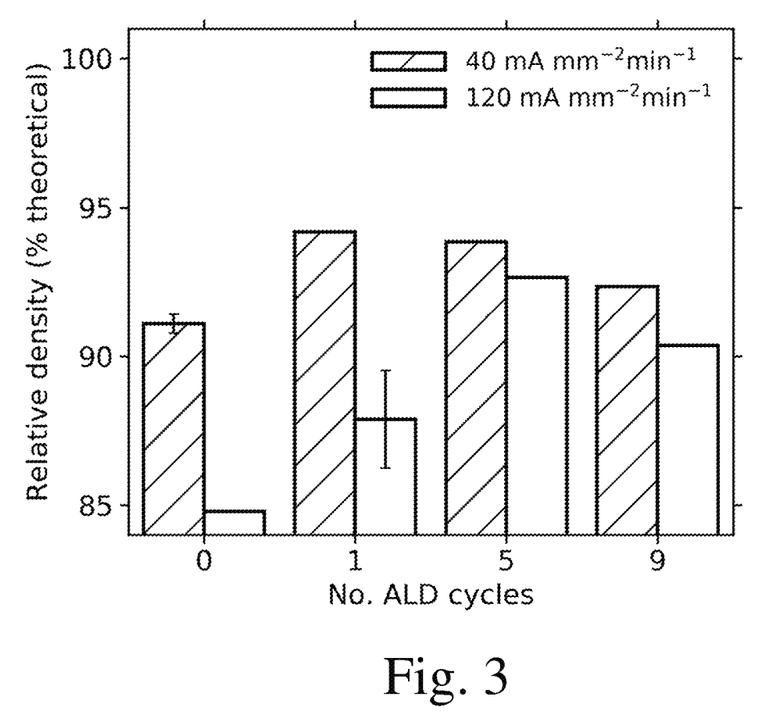
FIG. 3. The final relative densities of all samples after flash sintering. At a constant current-rate, the final density is higher for ALD-coated powders as compared to uncoated powders.
Figure 4:
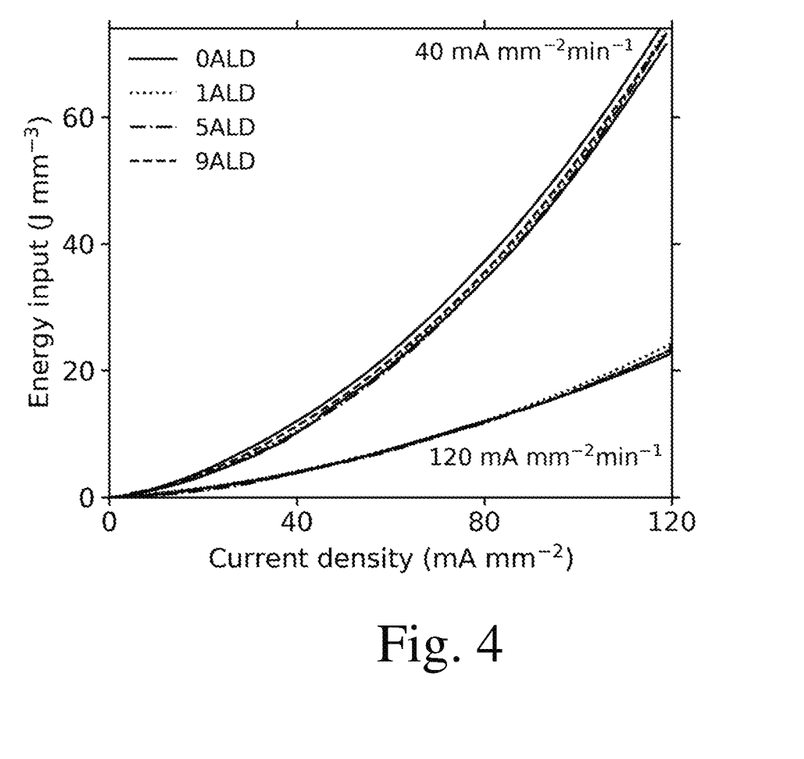
FIG. 4. The total energy input normalized by volume during flash sintering experiments. For given current-rate, the total energy input of the ALD-coated powders is similar to that of the uncoated powders.

The homogeneous addition of $Al_2O_3$ to 8YSZ by Particle ALD increased the final density relative to uncoated 8YSZ during current-rate flash sintering experiments (FIG. 3). At a current-rate of 40 mA $mm^{-2}$ $min^{-1}$, 1ALD had the highest final relative density (94.2%), a 3.1% increase in final density relative to the uncoated sample. At 120 mA $mm^{-2}$ $min^{-1}$, 5ALD had the highest relative density (92.7%), a 7.9% increase in final density relative to the uncoated sample. Additionally, there was no significant differences in the total energy input (normalized by volume) between uncoated and coated powders for a given current-rate (FIG. 4). Thus, a small quantity of homogenous, amorphous $Al_2O_3$ added by Particle ALD enhances densification and enables achievement of a higher final density without use of additional electrical energy during current-rate flash sintering. The significant difference in the final densities of ALD-coated versus uncoated powders suggests that the presence of well-dispersed amorphous $Al_2O_3$ enhances the diffusion of the $Zr^{4+}$ cation (the species controlling densification) during flash sintering by altering the chemical environment at the grain boundaries or within the lattice. An increase in the final density of 8YSZ parts will enhance both mechanical strength and ionic conductivity which is beneficial in SOFC applications.

Figure 8:
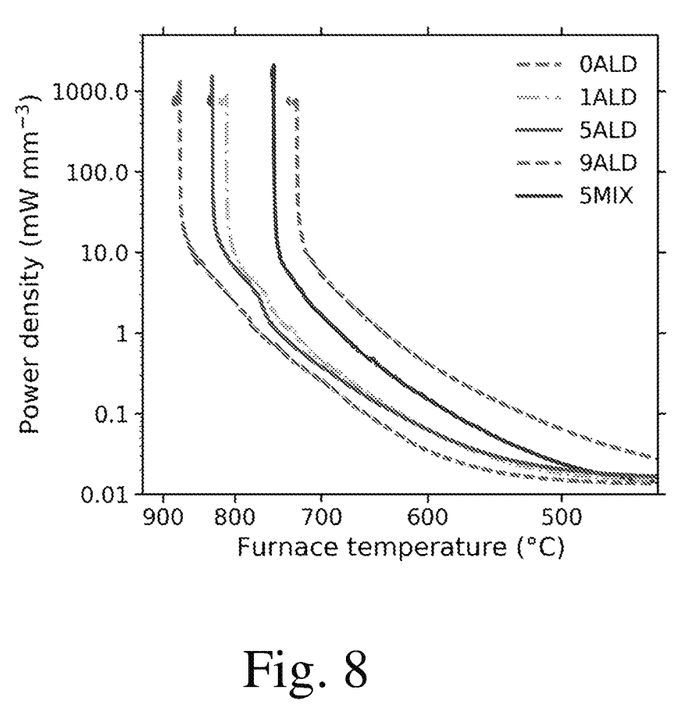
FIG. 8. Arrhenius plots for voltage-to-current control flash experiments. The electric field across the sample was 300 V $cm^{-1}$ and the current density limit was 120 mA $mm^2$. The graph shows that all of the ALD coated samples sintered at higher temperature as compared to either the uncoated particles (far right) or simple mixture (second to right).

During a 40 mA $mm^{-2}$ $min^{-1}$ current rate flash sintering experiment, all samples reached a similar final temperature of 1697-1743° C. The final temperature of samples sintered at 120 mA $mm^{-2}$ $min^{-1}$ are 1583±45, 1670±32, 1701±38, 1674° C. for 0ALD, 1ALD, 5ALD, and 9ALD, respectively. These final temperatures correlate with final density (FIG. 3), where samples that reach a higher final temperature have a higher final density. FIG. 8 shows the power density as a function of furnace temperature. Densification during flash sintering occurs at temperatures that are similar to those for conventional sintering constant rate of heating experiments (1150-1450° C.) for the same starting powders (0ALD, 1ALD, 5ALD, 9ALD). However, during flash sintering, samples reach their final density in just 1-2 minutes, much more rapidly than conventional sintering.

Figure 5:
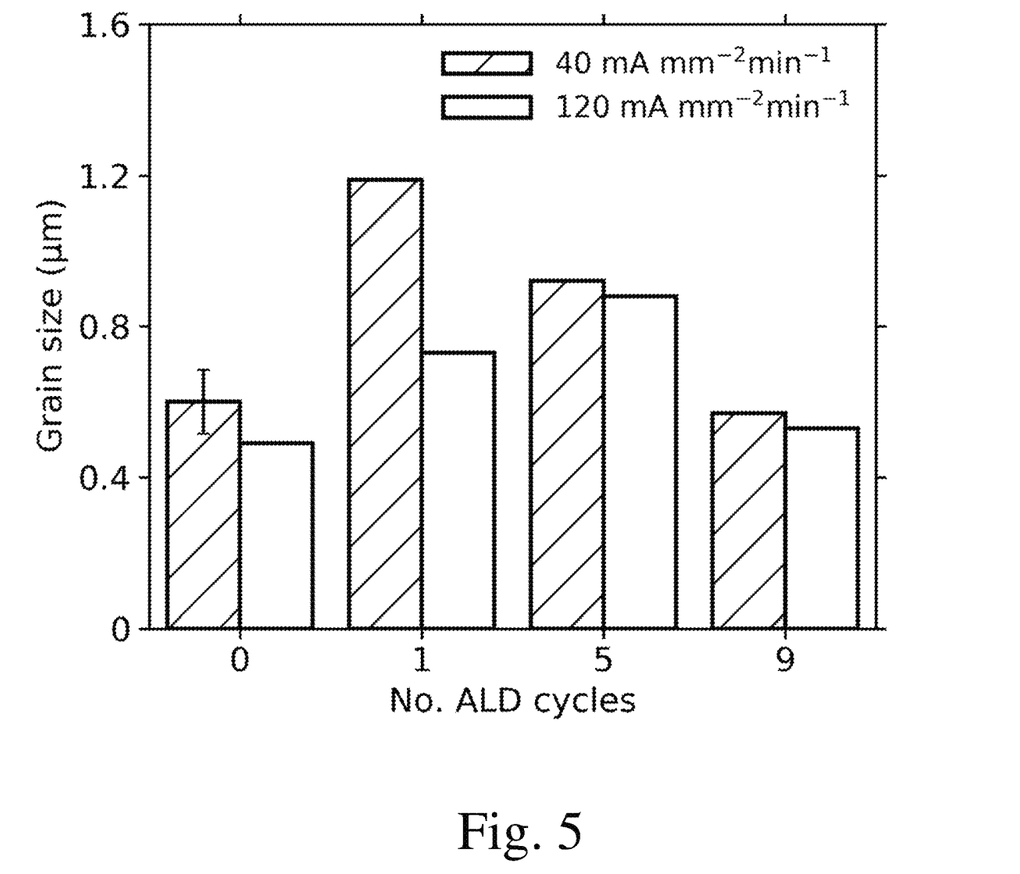
FIG. 5. The grain size of all samples after flash sintering experiments. The addition of a small amount of $Al_2O_3$ (1ALD and 5ALD) enhances grain growth, while larger quantities of $Al_2O_3$ (9ALD) begin to hinder grain growth.

The final grain size after flash sintering experiments was determined by SEM (FIG. 5). The addition of 0.7-2.2 wt % $Al_2O_3$ (1ALD and 5ALD) increased the grain size relative to 0ALD. A small amount of added $Al_2O_3$ enhances grain growth during current-rate flash sintering experiments, likely due to the dissolution of the $Al^{3+}$ cation into the grain boundaries which may increase grain boundary mobility. The addition of about 2 wt % $Al_2O_3$ by particle ALD (5ALD) results in the greatest increase in final density. The addition of 4.3 wt % $Al_2O_3$ (9ALD) reduces the grain size relative to 1ALD and 5ALD and approximately equals the grain size of 0ALD. This decrease in grain size is caused by the grain boundary pinning effect of amorphous $Al_2O_3$ inclusions, which begins to dominate grain growth at ~4.3 wt % $Al_2O_3$ (9ALD). While the grain size of 9ALD is similar to that of 0ALD, the final density of 9ALD is greater than that of 0ALD for both current-rates. Thus, by precisely varying the amount of $Al_2O_3$ addition by Particle ALD, the resulting grain size can be either increased or decreased while achieving a high final density after current-rate flash sintering.

Microstructural Analysis

Figure 6:
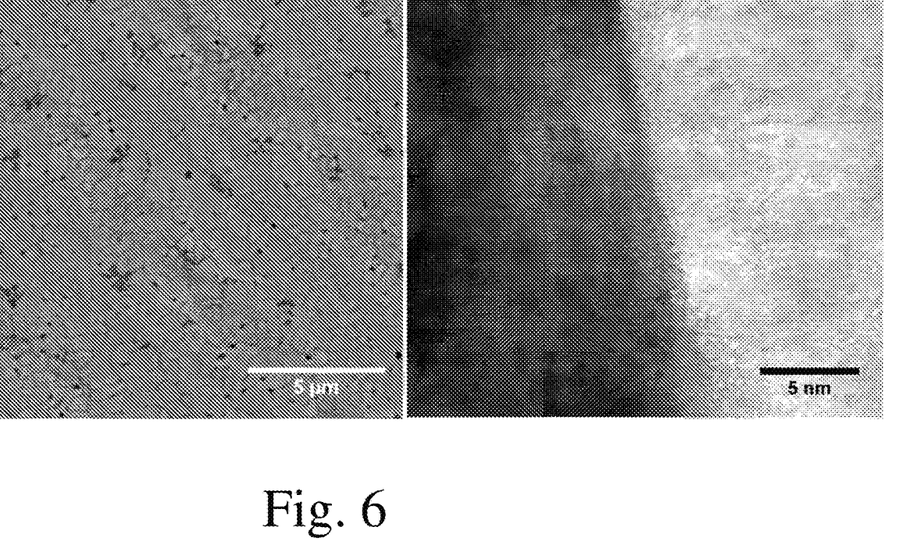
FIG. 6. Scanning electron microscopy with backscattered electron detection (left) and transmission electron microscopy (right) images of 5ALD flash sintered at 40 mA $mm^{-2}$ $min^{-1}$. Scanning electron microscopy showed well-dispersed, irregularly-shaped $Al_2O_3$ inclusions (dark grains). Transmission electron microscopy revealed that the YSZ grains are crystalline while the $Al_2O_3$ inclusions remain largely amorphous.

SEM with backscattered electron detection and TEM can be used to characterize the microstructures of the samples after flash sintering. It was observed in the micrographs of 1ALD, 5ALD, and 9ALD that both intergranular and intragranular $Al_2O_3$ inclusions were homogeneously dispersed throughout the 8YSZ grains (FIG. 6). As observed by TEM, periodicity in the YSZ grains showed that they were crystalline, and the $Al_2O_3$ grains did not exhibit periodicity and were largely amorphous after sintering (FIG. 6). Thus, the addition of $Al_2O_3$ by Particle ALD prior to flash sintering leads to the development of a microstructure with well-dispersed amorphous $Al_2O_3$ inclusions.

To test the hypothesis that the densification of a given sample is controlled by the same diffusion mechanism during both flash and conventional sintering, the sintering rate equation[23,24] (Equation 6) can be used:

$$\frac{d\rho}{dt} = \frac{Af(\rho)}{Td^n}\exp\left(-\frac{Q}{RT}\right)\bigg|_{\frac{d\rho}{dt_{max}}} \quad [6]$$

where dρ/dt is the densification rate, A a material dependent constant, ƒ(ρ) a function of density, d the grain size, n the grain size power law, Q the activation energy of sintering, and R the ideal gas constant. To determine dρ/dt, the densification curves for both the flash and conventionally sintered 0-9ALD samples were fit to a sigmoid function to determine ρ(t) and numerically differentiated. Assuming the mechanism of densification is the same for both conventional and flash sintering (i.e., n and Q are constant) and A, ƒ(ρ), and d are approximately constant for a given sample type, the ratio of Equation 7 evaluated for both flash and conventional sintering is as follows:

$$\frac{\left(\frac{d\rho}{dt}\right)_{flash,max}}{\left(\frac{d\rho}{dt}\right)_{conv,max}} = \frac{T_{conv,max}}{T_{flash,max}} \exp\left(-\frac{Q}{R}*\left(\frac{1}{T_{flash,max}} - \frac{1}{T_{conv,max}}\right)\right) \quad [7]$$

where) $(d\rho/dt)_{flash,max}$ is the maximum densification rate during flash sintering at temperature $T_{flash,max}$, and $(d\rho/dt)_{conv,max}$ is the maximum densification rate during conventional sintering at temperature $T_{conv,max}$. The right-hand side of the equation can be evaluated using the Q's for each sample, yielding an "expected" $(d\rho/dt)_{flash,max}/(d\rho/dt)_{conv,max}$ at $T_{flash,max}$ and $T_{conv,max}$ determined experimentally, and this can be compared to the experimentally observed $(d\rho/dt)_{flash,max}/(d\rho/dt)_{conv,max}$.

The experimentally observed $(d\rho/dt)_{flash,max}/(d\rho/dt)_{conv,max}$ was 16-22, but the temperatures where the maximum densification rate occurs for both experiments lead to an "expected" $(d\rho/dt)_{flash,max}/(d\rho/dt)_{conv,max}$ of only 0.2-0.3. The disagreement between the "expected" and experimentally observed $(d\rho/dt)_{flash,max}/(d\rho/dt)_{conv,max}$ suggests that the temperatures where flash sintering occurs are not high enough to increase the densification rate by the observed amount if the densification mechanism is assumed to be the same for both conventional and flash sintering. To achieve agreement between the expected and experimentally observed $(d\rho/dt)_{flash,max}/(d\rho/dt)_{conv,max}$, Q for flash sintering is estimated to be 8-13% less than that previously reported for conventional sintering. This reduction in Q may result from "elastic softening" of the lattice, which has been suggested previously by Yoon et al.[12]

In summary, analysis of the densification rates of flash and conventionally sintered samples revealed that the rapid densification of the flash sintered sample cannot be explained by Joule heating alone and suggests that the densification mechanism and sintering activation energy during flash sintering are not the same as those during conventional sintering.

Conclusions

Particle ALD was used to conformally coat 8YSZ particles with varying amounts of amorphous $Al_2O_3$ prior to current-rate flash sintering experiments. The amount of added $Al_2O_3$ was controllable by varying the number of ALD cycles, and the $Al_2O_3$ was homogenously dispersed prior to densification. The addition of an amorphous $Al_2O_3$ film increased the final density of 8YSZ during current-rate flash sintering. The optimal amount of $Al_2O_3$ addition to increase the final density was 1 and 5 $Al_2O_3$ALD cycles for current-rates of 40 and 120 mA mm$^{-2}$ min$^{-1}$, respectively. The addition of one $Al_2O_3$ALD cycle increased the flash temperature by 85° C. relative to pure-8YSZ, suggesting that the well-dispersed amorphous $Al_2O_3$ film in the ALD-coated sample effectively blocked the flow of current through the sample, reducing sample conductivity prior to flash. The addition of a small amount of $Al_2O_3$ (0.7-2.2 wt %) increased the grain size of 8YSZ. With larger amounts of $Al_2O_3$ addition (~4.3 wt %), the grain boundary pinning effect of $Al_2O_3$ inclusions became more significant and grain size was reduced relative to samples with a small amount of $Al_2O_3$ addition. Micrographs of the ALD-coated samples revealed that the addition of amorphous $Al_2O_3$ by Particle ALD led to a homogeneous dispersion of amorphous $Al_2O_3$ inclusions after flash sintering.

Figure 7:
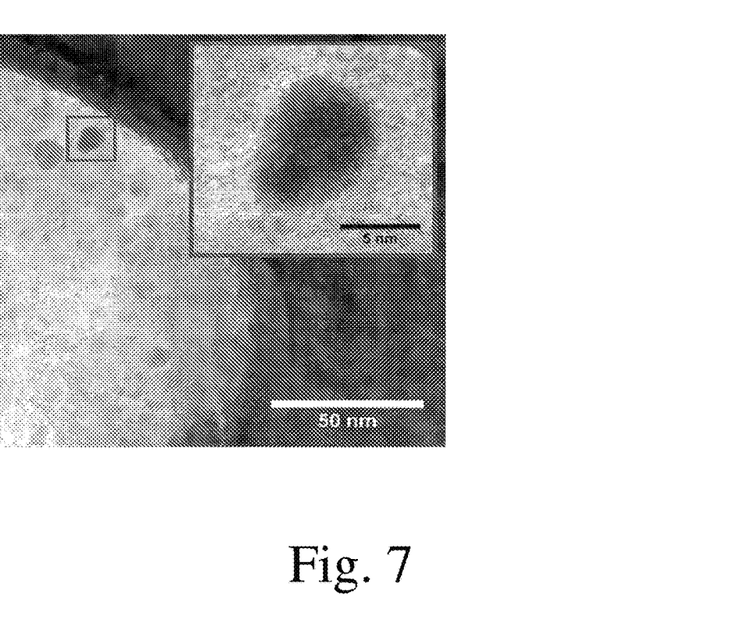
FIG. 7. Transmission electron microscopy image of a crystal nucleation site within the $Al_2O_3$ grain.

Micrographs of 5ALD and 5ALD showed dispersed $Al_2O_3$ inclusions with irregular shapes that are characteristic of an amorphous phase (FIG. 6). Prior to densification, the as-deposited $Al_2O_3$ nanofilm is amorphous and well-dispersed throughout the green body, but the final microstructure shows the $Al_2O_3$ film has diffused a distance on the order of ~1 μm to coalesce and form irregularly-shaped $Al_2O_3$ inclusions. To confirm the amorphous structure of the $Al_2O_3$ inclusions, TEM images were obtained for 5ALD sintered with a current rate of 40 mA mm$^{-2}$·min$^{-1}$ (FIG. 7). The grain boundary between an 8YSZ and $Al_2O_3$ grain (left) showed the crystal structure of the 8YSZ grains, but no lattice fringes were observed within the $Al_2O_3$ grains except for small crystalline inclusions indicating sites of crystal nucleation. Despite the temperature of the sample far exceeding the crystallization temperature of $Al_2O_3$ during the flash experiment, the $Al_2O_3$ inclusions remain largely amorphous. Because the amorphous $Al_2O_3$ inclusions are spatially confined during sintering, it is believed that the crystallization is less thermodynamically favorable due to the volume change that is concomitant with crystallization.[25] The confined $Al_2O_3$ inclusions remain amorphous during flash sintering.

What is claimed:

1. A method of flash sintering, comprising:
providing particles comprising a first phase of boron carbide and having a surface;
using ALD to grow a film of a second phase on the surface of the particles to form a coated powder composition; and
flash sintering the coated powder composition.

2. The method of claim 1 wherein the ALD coating on the coated powder composition is semi-continuous and covers 90% or less of the surface area of the particles.

3. The method of claim 1 comprising, prior to the step of flash sintering, mixing the coated powder with a binder, forming a shaped component, and heating the shaped component to burn out the binder.

4. The method of claim 1 wherein ALD is used to grow an alumina film.

5. The method of claim 1 comprising one to five cycles or one to eight cycles of ALD.

6. The method of claim 5 wherein the alumina film has a thickness of between about 0.5 nm and about 1 nm.

7. The method of claim 1 comprising at least 9 cycles of ALD.

8. The method of claim 1 wherein the second phase increases the temperature at which flash sintering occurs, relative to the first phase.

9. The method of claim 1 wherein the second phase decreases the temperature at which flash sintering occurs, relative to the first phase.

10. The method of claim 1 wherein the ALD coating on the coated powder composition is semi-continuous and covers 70% or less of the surface area of the particles.

11. The method of claim 1 wherein the ALD coating on the coated powder composition is semi-continuous and covers 50% or less of the surface area of the particles.

12. The method of claim 1 wherein the second phase comprises $Al_2O_3$, $Y_2O_3$, MgO, or $V_2O_5$.

13. The method of claim 1 wherein the flash sintering is performed at atmospheric pressure.

14. The method of claim 1 wherein the ALD includes providing a linker agent.

15. The method of claim 1 wherein the ALD includes providing a terminating agent.

16. The method of claim 1 wherein the film comprises titanium oxide.

17. The method of claim 1 wherein the film comprises titanium diboride.

18. The method of claim 1 wherein the particles have a diameter in the range of 100 micrometers to 500 micrometers.

19. The method of claim 1 wherein the film comprises an oxide, a nitride, a sulfide, a phosphide, a metal fluoride, a transition metal oxyfluoride, a transition metal oxynitride, a lanthanide, a boride, or a silicon-containing material.

20. The method of claim 1 wherein the film comprises $Al_2O_3$, $TiO_2$, ZnO, $ZrO_2$, $SiO_2$, $HfO_2$, $Ta_2O_5$, $LiNb_xO_y$, TiN, TaN, $W_2N$, $TiY_2N$, ZnS, CdS, SnS, $WS_2$, $MoS_2$, $ZnIn_2S_4$, GaP, InP, $Fe_{0.5}Co_{0.5}P$ $AlF_3$, $MgF_2$, $ZnF_2$, transition metal oxyfluorides or oxynitrides, a lanthanide, a boride, a carbide, or a silicon containing material.

* * * * *